(12) United States Patent
Gu

(10) Patent No.: US 8,065,596 B2
(45) Date of Patent: Nov. 22, 2011

(54) ITERATIVE DECODING FOR LAYER CODED OFDM COMMUNICATION SYSTEMS

(75) Inventor: Yongru Gu, Lake Forest, CA (US)

(73) Assignee: Newport Media, Inc., Lake Forest, CA (US)

(*) Notice: Subject to any disclaimer, the term of this patent is extended or adjusted under 35 U.S.C. 154(b) by 922 days.

(21) Appl. No.: 12/048,623

(22) Filed: Mar. 14, 2008

(65) Prior Publication Data
US 2009/0232256 A1 Sep. 17, 2009

(51) Int. Cl.
H03M 13/03 (2006.01)

(52) U.S. Cl. .......................... 714/795; 714/755; 714/794

(58) Field of Classification Search .................. 714/755, 714/794, 795
See application file for complete search history.

(56) References Cited

U.S. PATENT DOCUMENTS 7,464,316 B2 * 12/2008 Bickerstaff et al. ............ 714/755
2005/0172204 A1 * 8/2005 Lin ................................ 714/755
* cited by examiner Primary Examiner — Sam Rizk
(74) Attorney, Agent, or Firm — Rahman LLC

(57) ABSTRACT

A modified classical Viterbi decoder which can take extrinsic information and output hard decisions. A modified Viterbi decoder is provided comprising a branch metric unit, the unit having a calculator; and a processor adapted to compute a revised branch metric by combining the initial branch metric and an additional weight parameter. The modified classical Viterbi decoder computes a branch metric by summing an initial branch metric and the additional weight parameter.

20 Claims, 6 Drawing Sheets

ITERATIVE DECODING FOR LAYER CODED OFDM COMMUNICATION SYSTEMS

BACKGROUND

1. Technical Field

The embodiments herein generally relate to communication systems, and, more particularly, to layer coded orthogonal frequency division multiplexing (OFDM) communication systems.

2. Description of the Related Art

Concatenated coding schemes have been widely used in many OFDM communication systems. A concatenated coding scheme used in Integrated Services Digital Broadcasting—Terrestrial (ISDB-T), Digital Video Broadcasting—Terrestrial/Handheld (DVB-T/H), and Terrestrial—Digital Multimedia Broadcasting (T-DMB) has the convolutional code as the inner code and Reed-Solomon code as the outer code. Another concatenated decoding scheme uses the classic Viterbi decoder to decode the convolutional code. The Viterbi decoder outputs hard decisions, and the hard decisions are de-interleaved and passed on to a classic hard-decision RS decoder.

Turbo decoding for concatenated coding schemes involves iterative decoding and information exchanging between the inner decoder and the outer decoder. In turbo coding, a soft decision RS decoder and soft output convolutional code decoder is needed. The soft output convolutional code decoder can be a soft-output Viterbi decoder (SOVA) or a Bahl-Cocke-Jelinek-Raviv (BCJR) algorithm based MAP decoder. Both types of decoders are generally very complicated compared to the classical hard decision Viterbi decoder. A classical Viterbi decoder typically cannot take extrinsic information, and hence typically cannot be used in the iterative or turbo decoding schemes. Compared with the classic hard decision RS decoder, the soft decision RS decoder is also very complicated. In addition, the de-interleaver and interleaver may have to store soft decisions from the soft output convolutional code decoder and the soft decision RS decoder, and the memory to store the de-interleaved and interleaved soft decisions could be substantial.

SUMMARY

In view of the foregoing, an embodiment herein provides a Viterbi decoder comprising a branch metric unit, the unit having a calculator; and a processor adapted to compute a revised branch metric by combining the initial branch metric and the additional weight parameter. The calculator calculates an initial branch metric associated with a received symbol of an input bit of a data transmission stream; and calculates an additional weight parameter for the received symbol based only on extrinsic hard information, where the extrinsic hard information is based on output of a RS decoder or is based on specific known information transmitted and could be either of 1, 0 or unknown value. The additional weight parameter could be a positive value when the input bit of a data transmission stream matches with the extrinsic hard information or a non-positive value when the input bit of a data transmission stream does not match with the extrinsic hard information or the extrinsic hard information could not be determined.

Additionally, the embodiments provide a method of decoding in a Viterbi decoder in an OFDM receiver, wherein the method comprises calculating an initial branch metric associated with a received symbol of an input bit of a data transmission stream; calculating an additional weight parameter for the received symbol based only on extrinsic hard information; and computing a revised branch metric by combining the initial branch metric and the additional weight parameter. The extrinsic hard information is based on output of a RS decoder or is based on specific known information transmitted and could be either of 1, 0 or of unknown value. The additional weight parameter could be a positive value when the input bit of a data transmission stream matches with the extrinsic hard information or a non-positive value when the input bit of a data transmission stream does not match with the extrinsic hard information or the extrinsic hard information could not be determined.

A system to perform decoding of an information channel in an OFDM receiver on an input bit stream, the system comprising a Viterbi decoder adapted to decode the input bit stream; a de-interleaver adapted to perform de-interleaving on an output of the Viterbi decoder; a hard-decision Reed-Solomon (RS) decoder adapted to decode an output of the de-interleaver; and an interleaver adapted to interleave an output of the RS decoder in a feedback loop to the Viterbi decoder, wherein the Viterbi decoder comprises a branch metric unit comprising a calculator adapted to calculate an initial branch metric associated with a received symbol of an input bit of a data transmission stream; and calculate an additional weight parameter for the received symbol based only on extrinsic hard information. The branch metric unit further includes a processor adapted to compute a revised branch metric by combining the initial branch metric and the additional weight parameter.

The extrinsic hard information may be based on output of a RS decoder. Furthermore, the extrinsic hard information may be based on specific known information transmitted. Preferably, the extrinsic hard information comprises information that the input bit transmits from time n to time (n+1) and the input bit information equals one of zero; one; and unknown. Furthermore, the additional weight parameter may comprise a positive value when the input bit of a data transmission stream matches with the extrinsic hard information. Moreover, the additional weight parameter may comprise one of a non-positive value when the input bit of a data transmission stream does not match with the extrinsic hard information; and a non-positive value when the extrinsic hard information is not determined.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
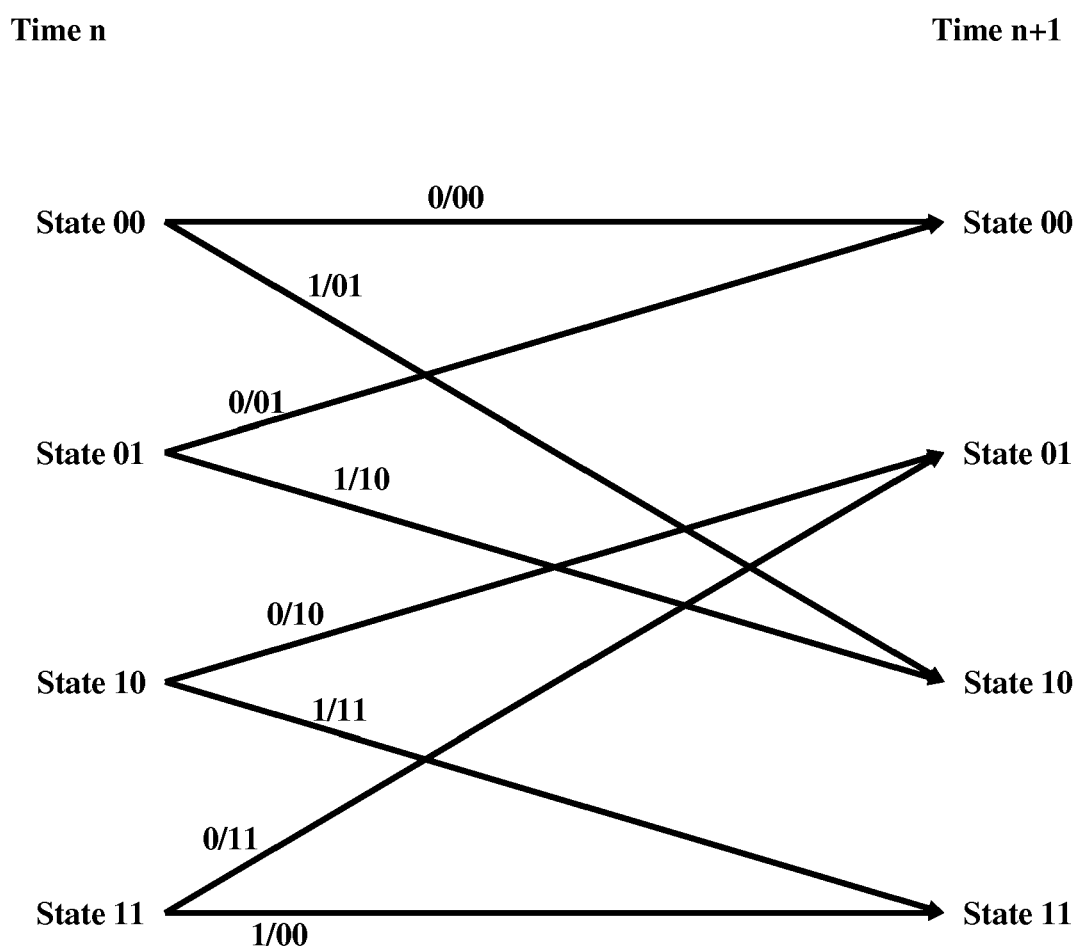
FIG. 1 illustrates a trellis diagram for a convolutional code.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide decoding schemes for OFDM communication systems, which is less complex than conventional schemes and reduces the conventional hardware requirements by providing a modified classical Viterbi decoder. Referring now to the drawings, and more particularly to FIGS. 1 through 7, where similar reference characters denote corresponding features consistently throughout the figures, there are shown preferred embodiments.

A modified classical Viterbi decoder is provided herein that takes extrinsic hard information and outputs hard decisions. The modified classical Viterbi decoder differs from a classical Viterbi decoder in the process of branch metric calculations. In the modified classical Viterbi decoder, the branch metric for a transition of the modified Viterbi decoder is calculated as the sum of the original branch metric of the classical Viterbi decoder and an additional weight parameter.

FIG. 1 illustrates a trellis diagram for a convolutional code. To compute the branch metric for transition from state 00 to state 00 from time n to time n+1, assume channel soft information is x. The initial branch metric is a metric function of x and the output bits of the transition, and this metric function gives a numeric number indicating the distance between the channel soft information and the output bits of the transition. The initial branch metric is calculated as the distance between the output bits of the transition and the soft information from the channel. In the modified classical Viterbi decoder, an assumption is made that the metric function measures the distance between the channel soft information and the output bits. In the modified Viterbi decoder, an assumption is made that there is extrinsic information (extra information) available regarding the input bit transmitted from time n to time (n+1). The extrinsic information can be one of the following three kinds of information:
 (a) The input bit transmitted from time n to time (n+1) is supposed to be 1
 (b) The input bit transmitted from time n to time (n+1) is supposed to be 0
 (c) The input bit transmitted from time n to time (n+1) is "not sure".

Figure 2:
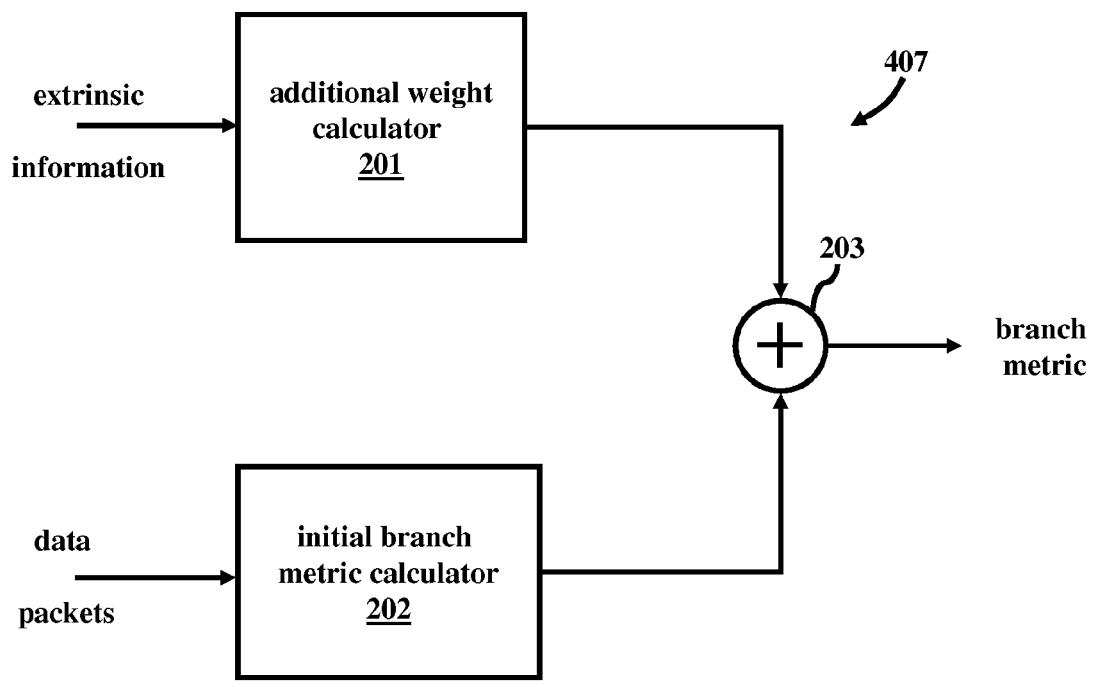
FIG. 2 illustrates a schematic of a modified classical Viterbi decoder according to a first embodiment herein.

The extrinsic information is used to compute an additional weight, and the branch metric of transition in the modified Viterbi decoder is the sum of the additional weight and the original branch metric of the classical Viterbi decoder, as shown in FIG. 2. FIG. 2 illustrates a schematic of a modified classical Viterbi decoder 407 according to a first embodiment herein, where the outputs of an additional weight calculator 201 and an initial branch metric calculator 202 are summed (i.e., using a processing mechanism 203) to obtain the branch metric. Extrinsic information is given as input to the additional weight calculator 201, while data packets are given as input to the initial branch metric calculator 202.

Figure 3:
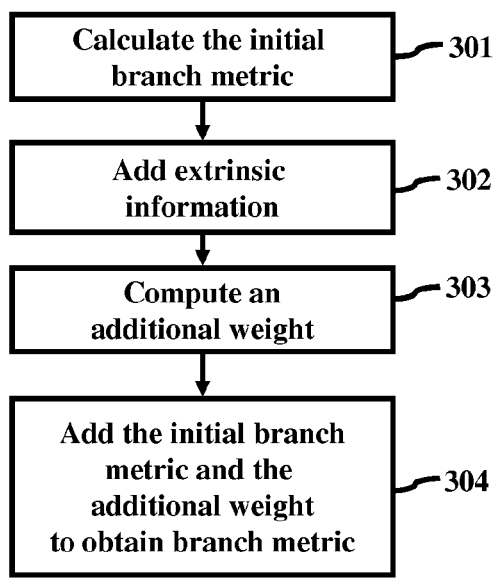
FIG. 3 is a flow diagram illustrating a preferred method according to a first embodiment herein.

FIG. 3 is a flow diagram illustrating a preferred method according to a first embodiment herein. The initial branch metric is calculated (301) by the modified Viterbi decoder 407 (of FIG. 2). After adding (302) the extrinsic information, the additional weight is computed (303). The initial branch metric and the additional weight are added (304) to obtain the branch metric.

An example of computing the additional weight is described herein. If the input bit of a transmission matches with the extrinsic information, a positive additional weight is assigned. If the input bit of a transmission does not match with the extrinsic information or the extrinsic information is not sure, the additional weight is assigned to 0. There could be several variations to compute the additional weight. When the extrinsic information matches with the input bit of a transition, a positive weight is given, if the extrinsic information is not sure or the input of a transition does not match with the extrinsic information, a zero weight or negative weight; i.e., a non-positive weight is assigned.

Figure 4:
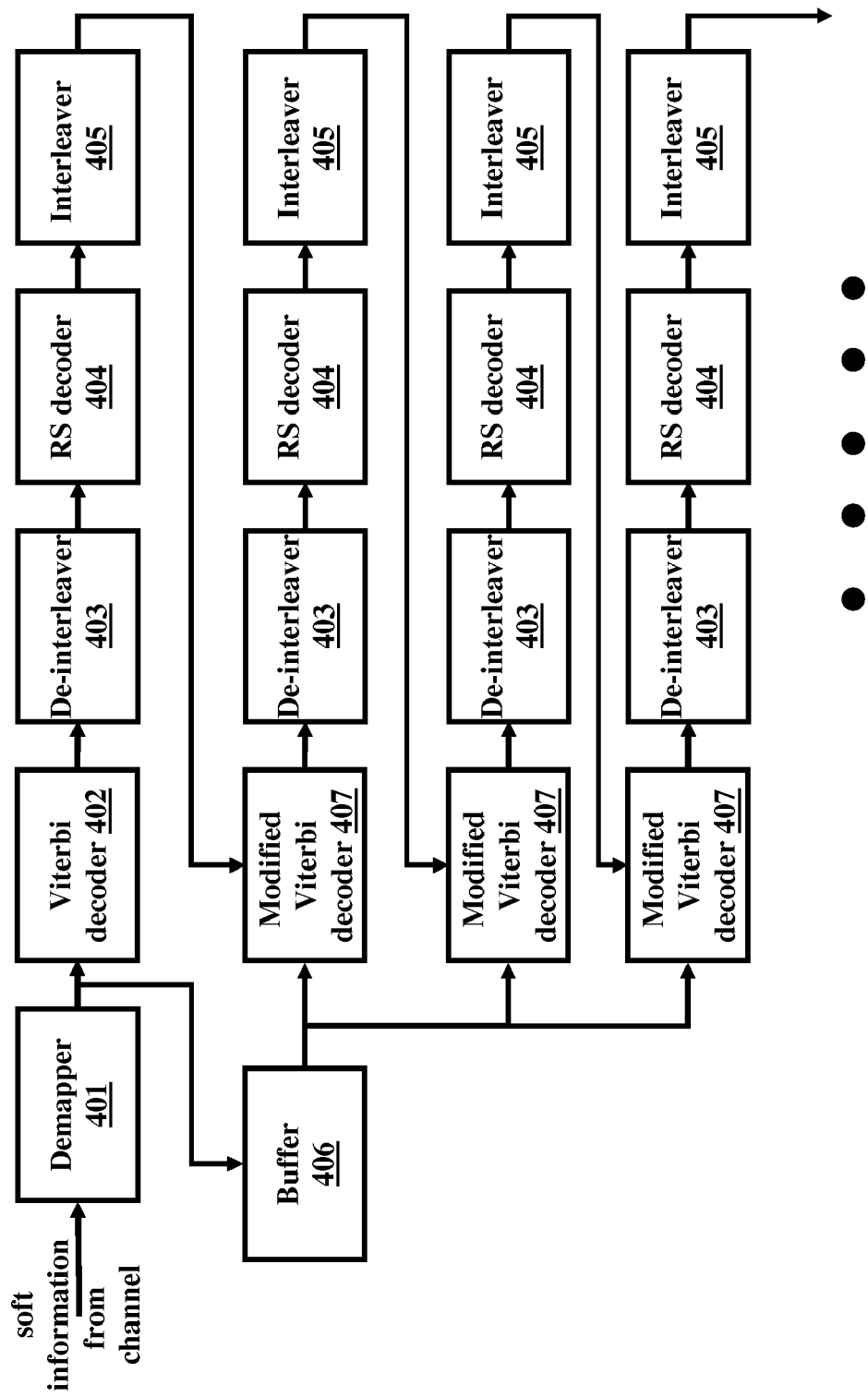
FIG. 4 illustrates a schematic diagram of an iterative decoding scheme according to a second embodiment herein.

Based on the modified classical Viterbi decoder 407 (of FIG. 2), an iterative/turbo decoding scheme is provided according to the embodiments herein, as illustrated in FIG. 4. First, soft information from the channel is input into a demapper 401, then a classical Viterbi decoder 402 is used to decode the convolutional code. The Viterbi decoder 402 outputs hard decisions, which are interleaved by a de-interleaver 403 and passed onto a classical hard decision RS decoder 404. The outputs from the RS decoder 404 are interleaved by interleaver 405 before being passed onto a modified classical Viterbi decoder 407. Three types of information are fed to the modified classical Viterbi decoder 407: 1, 0 or not sure. When the feedback bit belongs to a corrected transport packet, depending on the bit of the corrected transport packet, the modified classical Viterbi decoder 407 is fed a value of 1 or 0. In case the transport packet is uncorrectable, "not sure" information is fed back to the modified classical Viterbi decoder 407.

The modified classical Viterbi decoder 407 also receives the channel information, after the channel information has been passed through a buffer 406. The modified classical Viterbi decoder 407 outputs hard decisions, which are interleaved by a de-interleaver 403 and passed onto a classical hard decision RS decoder 404. The outputs from the RS decoder 404 are interleaved before onto a second bank of decoders and the iterations are repeated. The decoding scheme provided by the embodiments herein only involves hard decision exchange between the modified Viterbi decoder 407 and the RS decoder 404. For each iteration, a separate Viterbi and RS decoder is used as indicated in FIG. 4. For example, if four iterations are needed, then four Viterbi decoders and four RS decoders are used.

Figure 5:
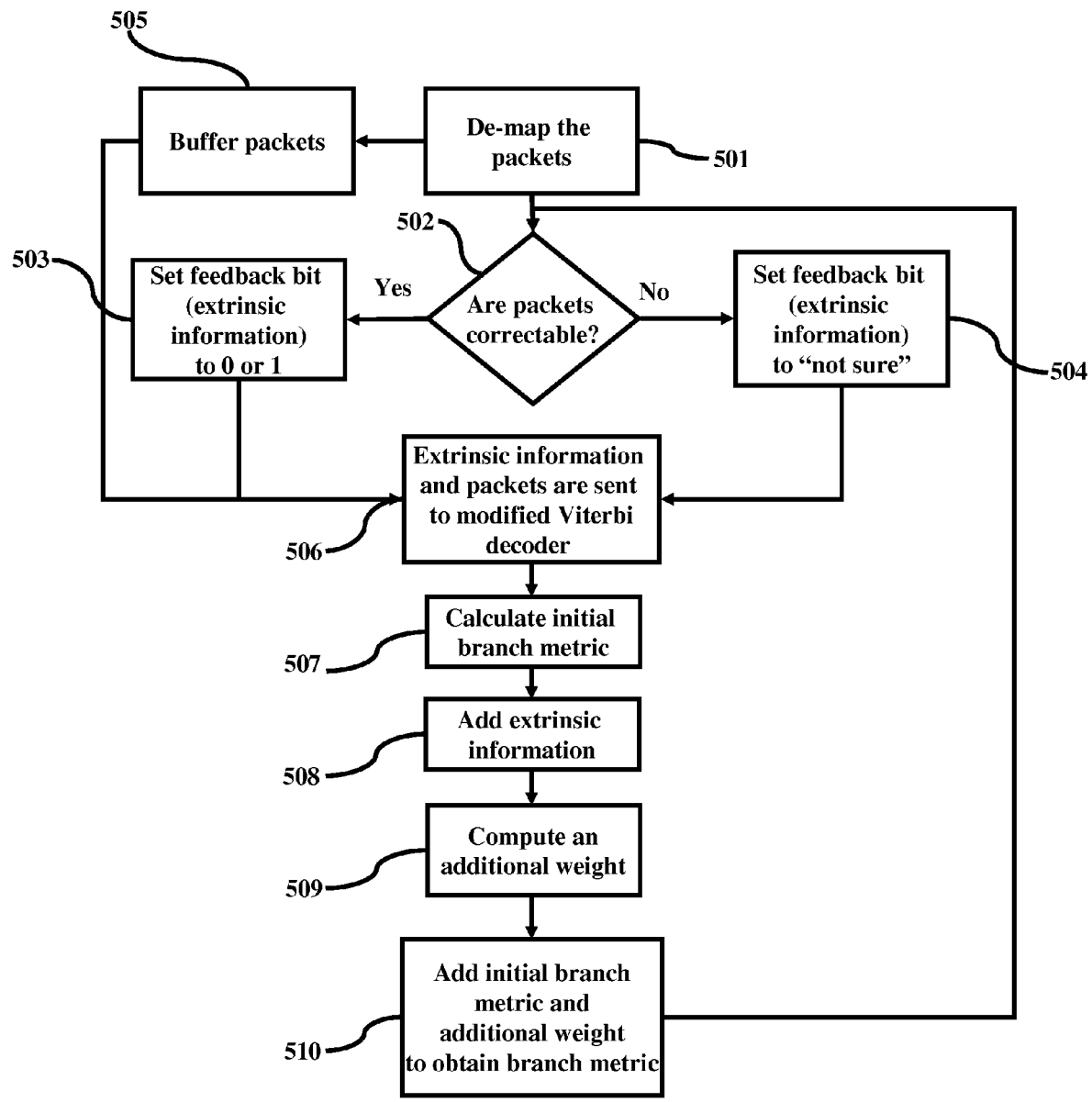
FIG. 5 is a flow diagram illustrating a preferred method according to a second embodiment herein.

FIG. 5, with reference to FIGS. 1 through 4, is a flow diagram illustrating a preferred method according to a second embodiment herein. Information from the channel is received by a demapper 401 and demapped (501) to produce soft information packets on all bits of the channel. The information packets are checked (502) to see if they are correctable. If the packets are not correctable (No), extrinsic information is set (504) to "not sure". If there are too many errors in a packet, the corrupted packet cannot be decoded and a failure decoding flag is issued. The extrinsic information for the entire packet would be "not sure". If the packets are correctable (Yes), extrinsic information is set (503) to either 1 or 0, depending on the bit of the corrected packet. If the number of errors is smaller than a standard number, the packets are successfully decoded and the errors are corrected. The extrinsic information is formed from the corrected codeword. For each bit, it is either 0 for 100% sure or 1 for 100% sure. The demapped packets are buffered (505) before being sent (506) to the modified classical Viterbi decoder 407, along with the extrinsic information. The initial branch metric is calculated (507) by the modified Viterbi decoder 407. After adding (508) the extrinsic information, the additional weight is computed (509). The initial branch metric and the additional weight are added (510) to obtain the branch metric. The process as described above is repeated as many times as needed. Generally, each additional iteration will provide some performance gain. However, each additional iteration will utilize additional power consumption, and additional silicon area on the chip. If enhanced performance is desired, then additional iterations are desirable. Conversely, if the cost of each additional iteration (in terms of power consumption and space on the chip), then less iterations are desirable.

To represent the three kinds of extrinsic information, 2 bits are used. For example, "10" (in binary) can be used to represent the first kind of feedback, and "11" can be used to represent the second kind of feedback, and "01" or "00" can be used to represent the third kind of feedback information.

Figure 6:
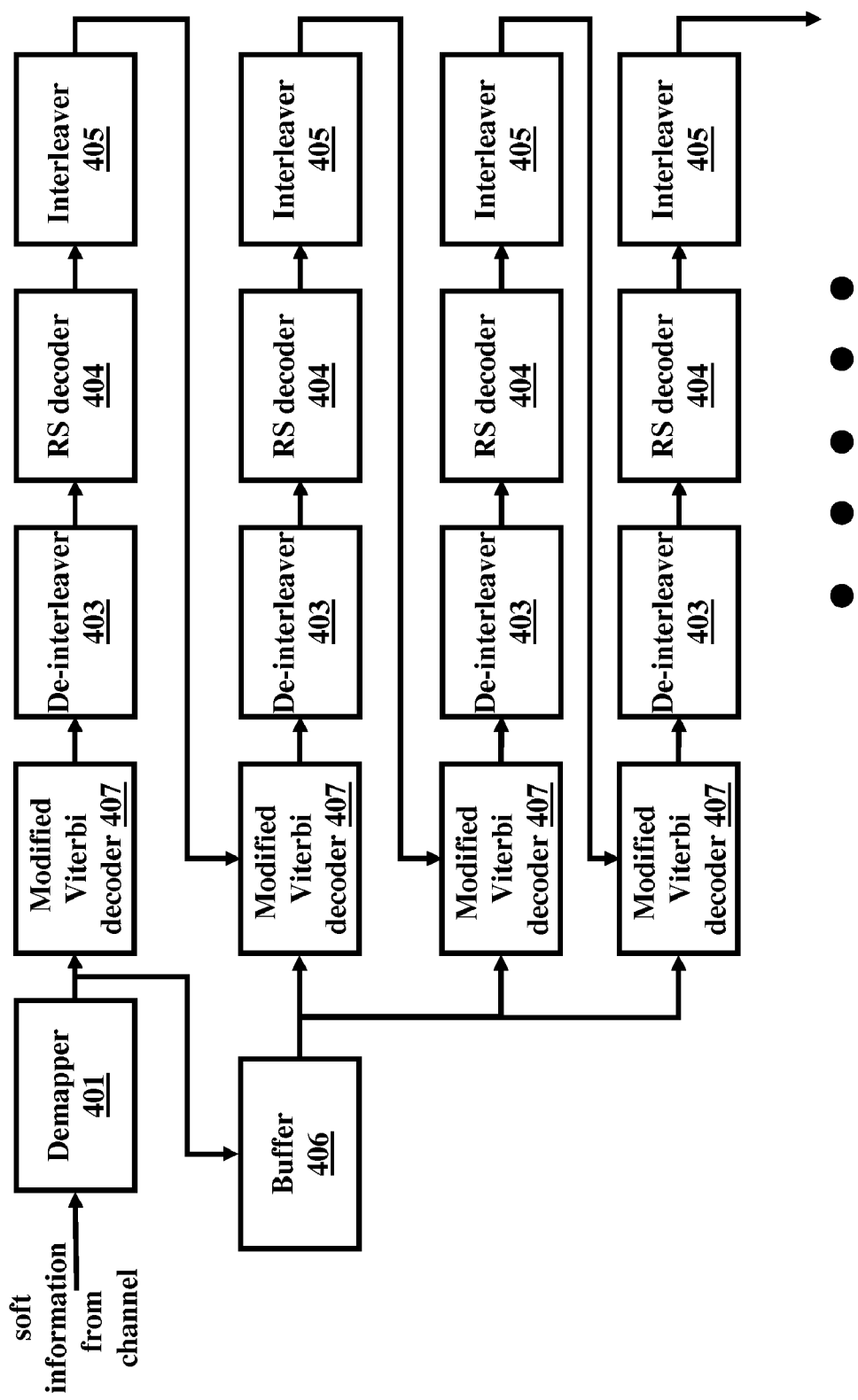
FIG. 6 illustrates a schematic diagram of an iterative decoding scheme according to a third embodiment herein.

In standards such as ISDB-T, DVB-H/T, and T-DMB, the first byte of each transmitted transport packet is known. For example, in ISDB-T, the first byte of a transport packet is always 47HEX. As the first-byte of each packet is known, the first byte of each packet is fed as extrinsic information for the first iteration. For bits that are unknown, "not sure" information is fed as extrinsic information for the first iteration. The classical Viterbi decoder 402 of FIG. 4 can be replaced by a modified Viterbi decoder 407, as shown in FIG. 6. First, soft information from the channel is input into a demapper 401, then the modified classical Viterbi decoder 407 is used to decode the convolutional code. The modified classical Viterbi decoder 407 outputs hard decisions, which are interleaved by a de-interleaver 403 and passed onto a classical hard decision RS decoder 404. The outputs from the RS decoder 404 are interleaved before being passed onto a second modified classical Viterbi decoder 407. Three kinds of information are fed to the modified classical Viterbi decoder 407: 1, 0, or not sure. When the feedback bit belongs to a corrected transport packet, depending on the bit of the corrected transport packet, feedback is either 1 or 0. In case the transport packet is uncorrectable, "not sure" information is fed back to the modified classical Viterbi decoder 407. The modified classical Viterbi decoder 407 also receives the channel information, after the channel information has been passed through a buffer 406. The modified classical Viterbi decoder 407 outputs hard decisions, which are interleaved by a de-interleaver 403 and passed onto a classical hard decision RS decoder 404. The outputs from the RS decoder 404 are interleaved before passing onto a second bank of decoders and the iterations are repeated. Even if a packet corrupted during transmission is not decoded, since the first byte of the packet is known, the first byte can be forced to be a corrected one, and depending on the content of the first byte, either 1 or 0 is fed back as extrinsic information for the subsequent decoding.

In a fourth embodiment, there is only one bank of decoders. Time-multiplexing is performed to share the modified classical Viterbi decoder 407 and RS decoder 404. For the different iteration stages needed, the modified classical Viterbi decoder 407 and RS decoder 404 are shared. For example, if four iterations are needed, just one modified classical Viterbi decoder 407 and one RS decoder 404 is used but the decoders are run four times as fast as the modified classical Viterbi decoders 407 and RS decoders 404 in the embodiment shown in FIG. 4.

Figure 7:
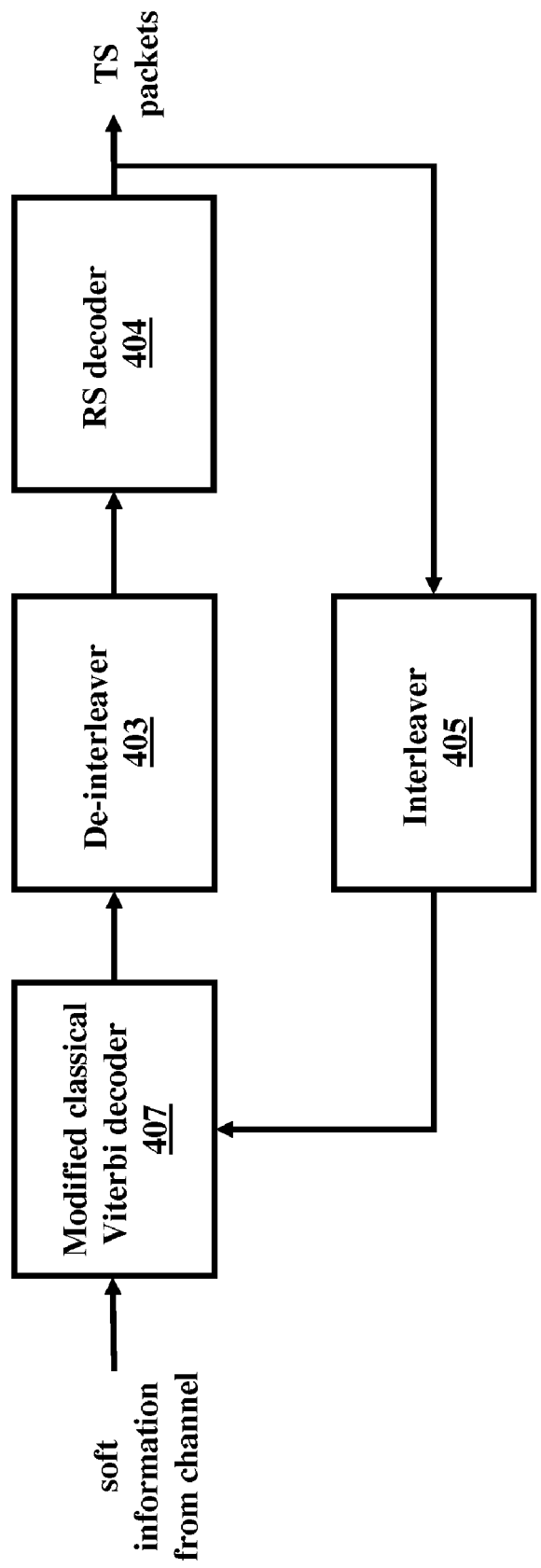
FIG. 7 illustrates a schematic diagram of an iterative decoding scheme according to a fourth embodiment herein.

FIG. 7 illustrates a schematic diagram of an iterative decoding scheme, according to the fourth embodiment herein. Soft information from the channel is given as input to the modified classical Viterbi decoder 407. The modified classical Viterbi decoder 407 outputs hard decisions, which are interleaved by a de-interleaver 403 and passed onto a classical hard decision RS decoder 404. The outputs from the RS decoder 404 are interleaved in interleaver 405 before being feedback to the modified classical Viterbi decoder 407. Three kinds of information are fed to the modified classical Viterbi decoder 407. When the feedback bit belongs to a corrected packet, depending on the bit of the corrected packet, feedback is either 1 or 0. In case the packet is uncorrectable, "not sure" information is fed back to the modified classical Viterbi decoder 407.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system comprising:
    a first component that decodes an input bit of data transmission stream;
    a second component that de-interleaves on an output of said first component;
    a third component that decodes an output of said second component;
    a fourth component that interleaves an output of said third component in a feedback loop to said first component;
    a fifth component adapted to:
        calculate an initial branch metric associated with a received symbol of said input bit of a data transmission stream; and
        calculate an additional weight parameter for said received symbol based only on extrinsic hard information; and
    a sixth component adapted to compute a revised branch metric by combining said initial branch metric and said additional weight parameter.

2. The system of claim 1, wherein said extrinsic hard information is based on output of a RS decoder.

3. The system of claim 1, wherein said extrinsic hard information is based on specific known information transmitted.

4. The system of claim 1, wherein said extrinsic hard information comprises information that said input bit transmits from time n to time (n+1) and equals 1.

5. The system of claim 1, wherein said extrinsic hard information comprises information that said input bit transmits from time n to time (n+1) and equals 0.

6. The system of claim 1, wherein said extrinsic hard information comprises information that said input bit transmits from time n to time (n+1) and is unknown.

7. The system of claim 1, wherein said additional weight parameter comprises one of:
    a positive value when said input bit of a data transmission stream matches with said extrinsic hard information;
    a non-positive value when said input bit of a data transmission stream does not match with said extrinsic hard information; and
    a non-positive value when said extrinsic hard information is not determined.

8. A method of decoding of an information channel in an orthogonal frequency division multiplexing (OFDM) receiver on an input bit stream, said method comprising:
    using a Viterbi decoder to decode said input bit stream;
    using a de-interleaver to de-interleave on an output of said Viterbi decoder;
    using a hard-decision Reed-Solomon (RS) decoder to decode an output of said de-interleaver;
    using an interleaver to interleave an output of the RS decoder in a feedback loop to said Viterbi decoder;
    calculating an initial branch metric associated with a received symbol of an input bit of a data transmission stream;
    calculating an additional weight parameter for said received symbol based only on extrinsic hard information; and
    computing a revised branch metric by combining said initial branch metric and said additional weight parameter.

9. The method of claim 8, wherein said extrinsic hard information is based on output of said RS decoder.

10. The method of claim 8, wherein said extrinsic hard information is based on specific known information transmitted.

11. The method of claim 8, wherein said extrinsic hard information comprises information that said input bit transmits from time n to time (n+1) and equals 1.

12. The method of claim 8, wherein said extrinsic hard information comprises information that said input bit transmits from time n to time (n+1) and equals 0.

13. The method of claim 8, wherein said extrinsic hard information comprises information that said input bit transmits from time n to time (n+1) and is unknown.

14. The method of claim 8, wherein said additional weight parameter comprises one of:
    a positive value when said input bit of a data transmission stream matches with said extrinsic hard information;
    a non-positive value when said input bit of a data transmission stream does not match with said extrinsic hard information; and
    a non-positive value when said extrinsic hard information is not determined.

15. A system to perform decoding of an information channel in an orthogonal frequency division multiplexing (OFDM) receiver on an input bit stream, said system comprising:
    a Viterbi decoder adapted to decode said input bit stream;

a de-interleaver adapted to perform de-interleaving on an output of said Viterbi decoder;

a hard-decision Reed-Solomon (RS) decoder adapted to decode an output of said de-interleaver; and an interleaver adapted to interleave an output of the RS decoder in a feedback loop to said Viterbi decoder, wherein said Viterbi decoder comprises a branch metric unit comprising:

a calculator adapted to:

calculate an initial branch metric associated with a received symbol of an input bit of a data transmission stream; and calculate an additional weight parameter for said received symbol based only on extrinsic hard information; and a processor adapted to compute a revised branch metric by combining said initial branch metric and said additional weight parameter.

16. The system of claim 15, wherein said extrinsic hard information is based on output of a RS decoder.

17. The system of claim 15, wherein said extrinsic hard information is based on specific known information transmitted.

18. The system of claim 15, wherein said extrinsic hard information comprises information that said input bit transmits from time n to time (n+1) and said input bit information equals one of:

zero;

one; and unknown.

19. The system of claim 15, wherein said additional weight parameter comprises a positive value when said input bit of a data transmission stream matches with said extrinsic hard information.

20. The system of claim 15, wherein said additional weight parameter comprises one of:

a non-positive value when said input bit of a data transmission stream does not match with said extrinsic hard information; and a non-positive value when said extrinsic hard information is not determined.

* * * * *